United States Patent
Kim et al.

(10) Patent No.: US 7,893,482 B2
(45) Date of Patent: Feb. 22, 2011

(54) SEMICONDUCTOR DEVICES HAVING TUNNEL AND GATE INSULATING LAYERS

(75) Inventors: Chul-sung Kim, Gyeonggi-do (KR); Young-jin Noh, Gyeonggi-do (KR); Bon-young Koo, Gyeonggi-do (KR); Sung-kweon Baek, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 113 days.

(21) Appl. No.: 12/428,078

(22) Filed: Apr. 22, 2009

(65) Prior Publication Data

US 2009/0206383 A1 Aug. 20, 2009

Related U.S. Application Data

(62) Division of application No. 11/776,297, filed on Jul. 11, 2007, now Pat. No. 7,537,993.

(30) Foreign Application Priority Data

Sep. 21, 2006 (KR) .............................. 2006-91967

(51) Int. Cl.
*H01L 29/788* (2006.01)
(52) U.S. Cl. .................... 257/315; 257/316; 257/E29.3
(58) Field of Classification Search .................. 257/315, 257/316, E29.3; 438/257, 258
See application file for complete search history.

(56) References Cited

U.S. PATENT DOCUMENTS 6,417,048 B1 7/2002 Tsemg

FOREIGN PATENT DOCUMENTS

| JP | 09307081 | 11/1997 |
| JP | 2003188291 | 7/2003 |
| JP | 2005317645 | 11/2005 |
| KR | 10200500000190 A | 1/2005 |
| KR | 105005046063 | 5/2005 |
| KR | 10200500073370 A | 7/2005 |
| KR | 1020060068848 A | 6/2006 |

OTHER PUBLICATIONS

Notice of Allowance for Korean Patent Application 10-2006-0091967; Jan. 24, 2008.

*Primary Examiner*—Roy K Potter
(74) *Attorney, Agent, or Firm*—Myers Bigel Sibley & Sajovec

(57) ABSTRACT

A semiconductor device includes a semiconductor substrate having a surface, buried isolation regions protruding from the surface of the semiconductor substrate, and a first insulating layer on the surface of the semiconductor substrate between the isolation regions and including a fluorine, nitrogen, and/or heavy hydrogen impurity. A floating electrode is on the first insulating layer, a second insulating layer is on the floating electrode and the isolation regions, and a control gate electrode is on the second insulating layer. Related methods of forming semiconductor devices are also disclosed.

10 Claims, 9 Drawing Sheets

SEMICONDUCTOR DEVICES HAVING TUNNEL AND GATE INSULATING LAYERS

CLAIM OF PRIORITY

This application a divisional application of U.S. patent application Ser. No. 11/776,297 filed Jul. 11, 2007 now U.S. Pat. No. 7,537,993 which claims priority from Korean Patent Application No. 10-2006-0091967 filed on Sep. 21, 2006 in the Korean Intellectual Property Office, the disclosures of which are incorporated herein by reference in its entireties.

FIELD OF THE INVENTION

The present invention relates to methods of fabricating semiconductor devices, and more particularly, to semiconductor devices having gate insulating layers, and to methods of fabricating the same.

BACKGROUND

Semiconductor devices are extensively used as memory devices in devices ranging from microcontrollers to credit cards. Semiconductor memory devices may be classified as volatile memory devices, such as DRAMs or SRAMs, which are capable of inputting and outputting data rapidly, but in which the data can be erased with time, and nonvolatile memory devices, such as ROMs, in which inputting and outputting of data are performed slowly, but the data can be stored more permanently. Recently, nonvolatile memories, such as EEPROMs and flash memory devices, in which inputting and outputting of data can be performed electrically, have been developed.

For example, an EEPROM or a flash memory device has a structure in which a tunnel oxide film, a floating electrode, a gate insulating layer, and a control gate electrode are formed on a semiconductor substrate. In an EEPROM or the flash memory device, data can be electrically programmed and erased using a F-N tunneling process and/or a channel hot electron injection process. During the programming and/or the erasing of the data, electrons and/or holes move through the tunnel oxide film between the floating electrode and the semiconductor substrate.

However, in a silicon oxide film that is typically used as the tunnel oxide film, a portion of Si in the oxide film may not be properly bonded to Si or O atoms, resulting in Si dangling bonds and/or imperfect Si bonding states. The presence of dangling Si bonds may impair leakage current properties of the tunnel oxide film and/or electron retention properties of the floating electrode.

SUMMARY

A semiconductor device according to some embodiments of the invention includes a semiconductor substrate having a surface, buried isolation regions protruding from the surface of the semiconductor substrate, and a first insulating layer on the surface of the semiconductor substrate between the isolation regions and including a fluorine, nitrogen, and/or heavy hydrogen impurity. A floating electrode is on the first insulating layer, a second insulating layer is on the floating electrode and the isolation regions, and a control gate electrode is on the second insulating layer.

The floating electrode may include a non-implanted surface, and the second insulating layer may be on the non-implanted surface of the floating electrode.

The first insulating layer may include a silicon oxide film including an Si—F bond. The floating electrode may include a fluorine, nitrogen, and/or heavy hydrogen impurity. In some embodiments, the floating electrode may include polysilicon including an Si—F bond.

A semiconductor device according to further embodiments of the invention includes a semiconductor substrate including a surface, buried isolation regions protruding from the surface of the semiconductor substrate, and a first insulating layer on the semiconductor substrate between the isolation regions and including a fluorine, nitrogen, and/or heavy hydrogen impurity. A floating electrode is on the first insulating layer and includes a first conductive layer and a second conductive layer. A second insulating layer is on the floating electrode and the isolation regions, and a control gate electrode is on the second insulating layer.

The first conductive layer may be between the first insulating layer and the second conductive layer, and the first conductive layer may include the fluorine, nitrogen, and/or heavy hydrogen impurity. The second conductive layer may be substantially free of the fluorine, nitrogen, and/or heavy hydrogen impurity.

The first insulating layer may include a silicon oxide film including an Si—F bond. The first conductive layer may include a fluorine, nitrogen, and/or heavy hydrogen impurity. In particular, the first conductive layer may include polysilicon including an Si—F bond.

Some embodiments provide methods of forming a semiconductor device. The methods include providing a semiconductor substrate including a surface, forming buried isolation regions that protrude from the surface of the semiconductor substrate, and forming a first insulating layer on the semiconductor substrate between the isolation regions. The methods further include forming a conductive layer on the first insulating layer and the isolation regions so that the conductive layer may be on the first insulating layer in a space between the isolation regions. Impurity ions, including fluorine, nitrogen, heavy hydrogen, and/or oxygen, are implanted into the first insulating layer through the conductive layer. A portion of an upper region of the conductive layer is removed.

Removing the portion of the upper region of the conductive layer may be performed using an etch back process and/or a CMP process.

The methods may further include dividing the conductive layer by the isolation regions during or after removing the portion of the upper region of the conductive layer. The conductive layer may be divided using an etch back process and/or a CMP process.

Implanting the impurity ions may be performed using an ion implantation energy of about 10 keV to about 30 keV and a dose of about $1.0E14$ atoms/cm$^2$ to about $1.0E16$ atoms/cm$^2$.

The resulting structure may be heat treated at about 850° C. to about 1000° C. for about 30 min. to about 50 min.

The methods may further include forming a second insulating layer and a control gate electrode on the resulting structure after removing the portion of the upper region of the conductive layer.

Methods of fabricating a semiconductor device according to further embodiments of the invention include providing a semiconductor substrate having a surface, forming partially buried isolation regions that protrude from the surface of the semiconductor substrate, and forming a first insulating layer on the semiconductor substrate between the isolation regions. The methods further include forming a first conductive layer on the first insulating layer and the isolation regions so that the first conductive layer may be on the first insulating layer in a space between the isolation regions. Impurity ions, including fluorine, nitrogen, heavy hydrogen, and/or oxygen, are implanted into the first insulating layer through the first conductive layer, and a second conductive layer is formed in a remaining space on the first conductive layer between the isolation regions.

Implanting the impurity ion may be performed using an ion implantation energy of about 10 keV to about 30 keV and a dose of about $1.0E14$ atoms/cm$^2$ to about $1.0E16$ atoms/cm$^2$.

The methods may further include heat treating the first conductive layer at about 850° C. to about 1000° C. for about 30 min. to about 50 min.

The methods may further include dividing the second conductive layer by the isolation regions, and forming a second insulating layer and a control gate electrode on the resulting structure after the second conductive layer is formed. The second conductive layer may be formed on the isolation regions.

Dividing the conductive layer may be performed using an etch back process and/or a CMP process.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS OF THE INVENTION

Figure 1:
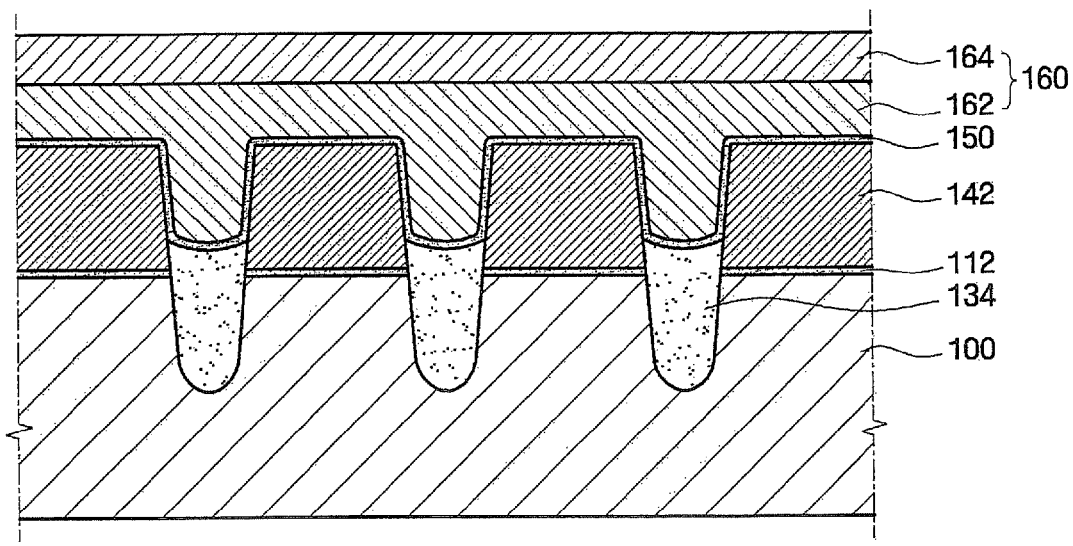
FIG. 1 is a cross-sectional view of a semiconductor device according to some embodiments of the present invention.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted regions. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Hereinafter, a description will be given of semiconductor devices according to embodiments of the present invention with reference to the accompanying drawings. In the following embodiments, a NAND-type charge trapped flash (CTF) memory device will be disclosed as a specific example of the semiconductor device. However, the semiconductor device is not limited thereto. Some embodiments of the present invention may be applied to a NOR-type charge trapped flash memory device and/or to an EEPROM device. Additionally, some embodiments of the present invention may be applied to semiconductor devices, such as DRAM or SRAM devices having a transistor.

FIG. 1 is a cross-sectional view of a semiconductor device according to some embodiments of the present invention. With reference to FIG. 1, a semiconductor device according to some embodiments of the present invention includes a plurality of floating electrodes 142 that are formed on a semiconductor substrate 100 and a control gate electrode 160 that covers the floating electrodes 142.

For example, the semiconductor substrate 100 may include Si, Ge, SiGe, GaP, GaAs, SiC, SiGeC, InAs, and/or InP. The semiconductor substrate 100 is divided into a plurality of cell regions by isolation regions 134. Each of the isolation regions 134 is partially buried and may simultaneously partially protrude above a surface of the semiconductor substrate 100. An upper side of the isolation region 134 may be sunken, but the shape of the upper side is not limited thereto. The isolation region 134 may be formed of a silicon oxide film. Examples of the film include a USG (Undoped Silicate Glass) oxide film, a PE-TEOS (Plasma Enhanced Tetra Ethyl Ortho Silicate) oxide film, and an HDP (High Density Plasma) oxide film.

The floating electrodes 142 are provided between the isolation regions 134 that protrude from the surface of the semiconductor substrate 100. The floating electrodes 142 may slightly protrude from upper surfaces of the isolation regions 134. In other words, the isolation regions 134 that are provided between the adjacent floating electrodes 142 have portions lower than the floating electrodes 142. For example, the floating electrode 142 may be made of metal and/or polysilicon into which an N-type impurity and/or a P-type impurity is doped. Additionally, the floating electrode may further include other impurities, for example, fluorine (F). When the floating electrode 142 is made of polysilicon, at least a portion of the impurities that are contained in the floating electrode 142 may be bonded to silicon to form a Si—F bond.

A first insulating layer 112 that is capable of acting as a tunnel oxide film is interposed between the floating electrode 142 and the semiconductor substrate 100. The first insulating layer 112 may be formed of an oxide film, such as a silicon oxide film. Additionally, the first insulating layer 112 may further include an impurity, such as fluorine. When the first insulating layer 112 is formed of silicon oxide, fluorine may be bonded to a Si dangling bond that is not bonded to Si or O in the first insulating layer 112, or substitution bonded to an unstable Si—Si or Si—O bond to form an Si—F bond. Accordingly, the number of the Si dangling bonds and unstable Si bonds may be relatively small in the first insulating layer 112. Since the above-mentioned bonds may be replaced by the more stable Si—F bond, the first insulating layer 112 may have excellent reliability as a tunnel oxide film.

In this regard, fluorine may be replaced by other impurities, such as nitrogen, heavy hydrogen, and/or oxygen. Additionally, the floating electrode 142 may include two or more types of impurities, such as fluorine, nitrogen, heavy hydrogen, and/or oxygen. Some embodiments of the invention may provide tunnel oxide films having improved reliability.

A second insulating layer 150 is formed on the floating electrode 142 and the isolation region 134. The second insulating layer 150 is formed on upper surfaces and lateral surfaces of the floating electrodes 142 and the upper surfaces of the isolation regions 134 that are recessed from the floating electrodes 142. In other words, the second insulating layer 150 may be conformally formed along the upper surfaces of the relatively protruding floating electrodes 142 and the relatively recessed isolation regions 134. For example, the second insulating layer 150 may include a silicon nitride film, a silicon oxide film, and/or a laminate film in which a silicon nitride film and a silicon oxide film are combined. For example, the second insulating layer may include a three-layered film of silicon oxide/silicon nitride/silicon oxide (O/N/O). The second insulating layer 150 may act as the gate insulating layer between the floating electrode 142 and the control gate electrode 160.

A control gate electrode 160 is formed on the second insulating layer 150. The control gate electrode 160 faces the floating electrodes 142 while the second insulating layer 150 is interposed between the control gate electrode 160 and the floating electrodes 142. Furthermore, since the isolation region 134 is recessed relative to the floating electrode 142, the control gate electrode 160 may surround walls of the floating electrodes 142. Accordingly, an area in which the control gate electrode 160 and the floating electrodes 142 face each other may be increased, which may increase the capacitance therebetween.

The control gate electrode 160 may include one or more conductive films. For example, as shown in FIG. 1, the control gate electrode 160 may include a first control gate electrode layer 162 that is provided at a lower portion of the control gate electrode 160 and may include doped polysilicon, and a second control gate electrode layer 164 that is provided at an upper portion of the control gate electrode 160 and may include metal and/or a metal silicide film. However, the control gate electrode may include other and/or different conductive layers.

A semiconductor device according to embodiments of the present invention may further include source/drain regions (not shown) that are formed in the semiconductor substrate 100. Moreover, the semiconductor device may further include interlayer insulating layers, vias, contacts, wires, and/or other conventional structures that are well known in the art.

Figure 2:
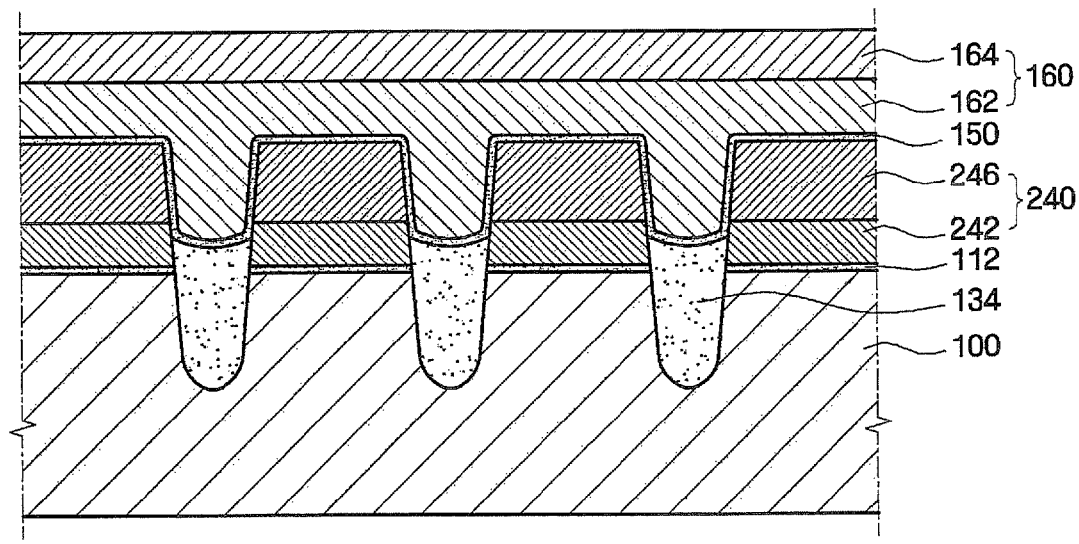
FIG. 2 is a cross-sectional view of a semiconductor device according to further embodiments of the present invention.

FIG. 2 is a cross-sectional view of a semiconductor device according to further embodiments of the present invention. Elements in the embodiments of FIG. 2 having the same reference numbers as elements of FIG. 1 are similar and will not be described again.

Embodiments according to FIG. 2 differ from the embodiments of FIG. 1 in that in the embodiments of FIG. 2, a floating electrode 240 includes a first conductive layer 242 and a second conductive layer 246.

For example, the first conductive layer 242 may include metal and/or polysilicon in which an N-type impurity and/or a P-type impurity is doped. The first conductive layer 242 may include impurities, such as fluorine, nitrogen, heavy hydrogen, and/or oxygen.

The second conductive layer 246 may include metal and/or intrinsic polysilicon, and/or polysilicon in which an N-type impurity and/or a P-type impurity is doped. Unlike the first conductive layer 242, the second conductive layer 246 may not include an impurity such as fluorine, nitrogen, heavy hydrogen, and/or oxygen. The material that constitutes the second conductive layer 246 may be the same as or different from the material that constitutes the first conductive layer 242. For example, the first conductive layer 242 may include polysilicon in which an N-type impurity is doped, and the second conductive layer 246 may include intrinsic polysilicon. When the first conductive layer 242 and the second conductive layer 246 have different physical properties, realization of properties of various types of devices, such as controlling the conductivities of cell regions, may be desirably obtained.

The upper side of the first conductive layer 242 may be doped using ion implantation at the interface between the first conductive layer 242 and the second conductive layer 246. However, since the second conductive layer 246 is formed on the first conductive layer 242, the upper side of the first conductive layer 242 may not come into direct contact with the second insulating layer 150. Thus, reliability of the second insulating layer 150 may be enhanced.

Methods of forming semiconductor devices will be described with reference to FIGS. 3 to 18.

FIGS. 3 to 12 are cross-sectional views of intermediate structures formed at stages of the methods of forming the semiconductor device shown in FIG. 1.

First, a semiconductor substrate that includes isolation regions protruding from a surface thereof and first insulating layers formed on the surface thereof between the isolation regions is formed, as illustrated in FIGS. 3 to 7.

Figure 3:
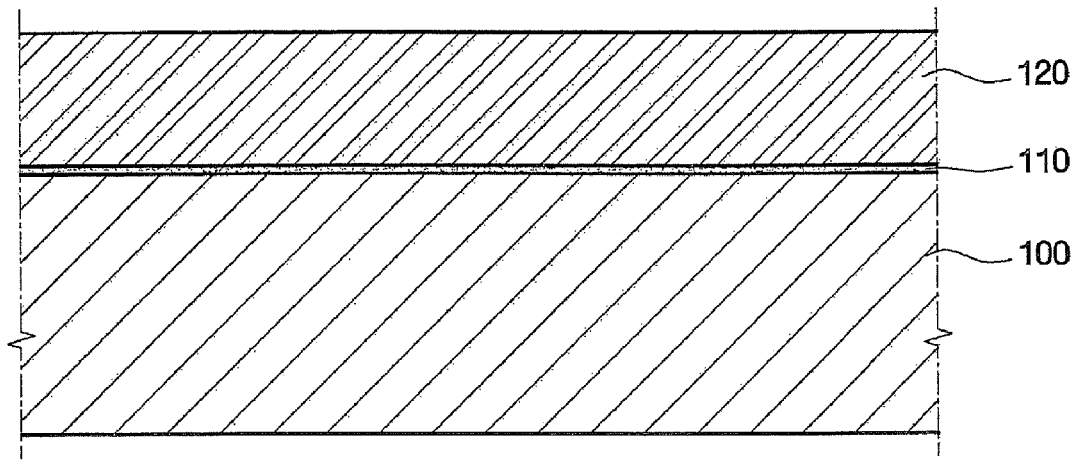
FIGS. 3 to 12 are cross-sectional views illustrating the formation of semiconductor devices according to some embodiments of the present invention.

With reference to FIG. 3, a first insulating layer 110 and a sacrificial layer 120 are sequentially formed on a surface of a semiconductor substrate 100.

The semiconductor substrate 100 may include, for example, Si, Ge, SiGe, GaP, GaAs, SiC, SiGeC, InAs, and/or InP.

The first insulating layer 110 may include an oxide film, such as a silicon oxide film. The sacrificial layer 120 may be formed of a nitride film, for example, a silicon nitride film. The first insulating layer 110 and the sacrificial layer 120 are sequentially formed using a process, for example, chemical vapor deposition (CVD), low pressure chemical vapor deposition (LPCVD), and/or plasma enhanced chemical vapor deposition (PECVD). When the first insulating layer 110 includes silicon oxide, the first insulating layer 110 may be formed using a thermal oxidation process.

Figure 4:
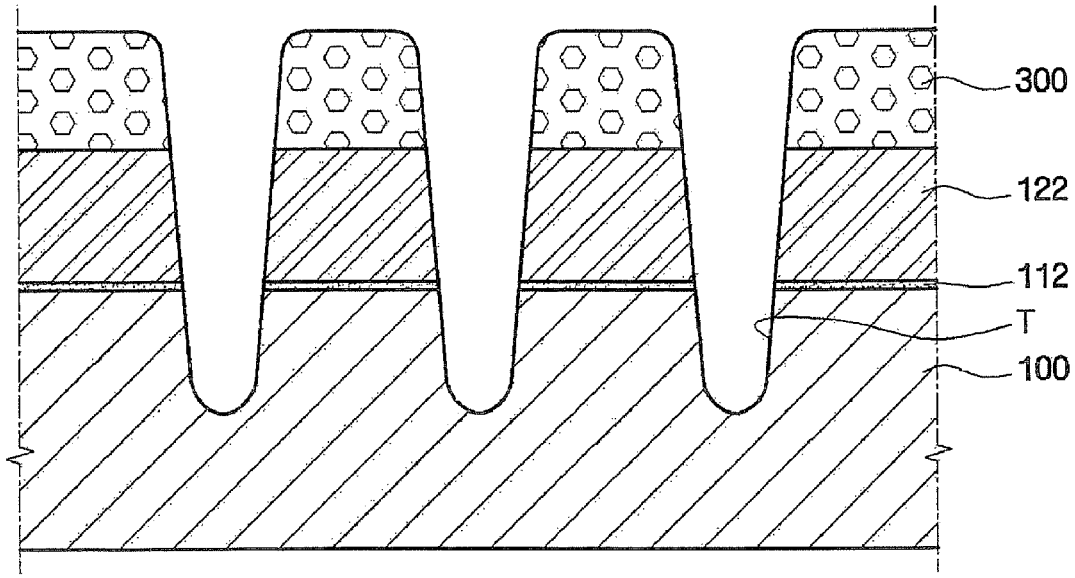

With reference to FIGS. 3 and 4, a photoresist film is formed on a front side of the resulting structure of FIG. 3. Subsequently, the photoresist film is exposed and developed to form a photoresist pattern 300 that defines isolation regions. Subsequently, the sacrificial insulating layer 120, the first insulating layer 110, and the semiconductor substrate 100 are sequentially etched using the photoresist pattern 300 as an etching mask in the exposed isolation region. In connection with this, the sacrificial insulating layer 120 and the first insulating layer 110 are completely removed in the exposed region. However, the semiconductor substrate 100 is etched to a predetermined depth so as to partially remain. The etching depth of the semiconductor substrate 100 may be controlled using, for example, time control etching and/or end point detection (EPD). A trench T is formed due to the etching of the semiconductor substrate 100. Reference numerals 112 and 122 that are additionally shown in FIG. 4 denote the first insulating layer and the sacrificial insulating layer after the etching. Meanwhile, after a hard mask is further layered on the sacrificial insulating layer, the resulting mask may be used as the etching mask to form the trench T at steps of FIGS. 3 and 4. This is not shown.

Figure 5:
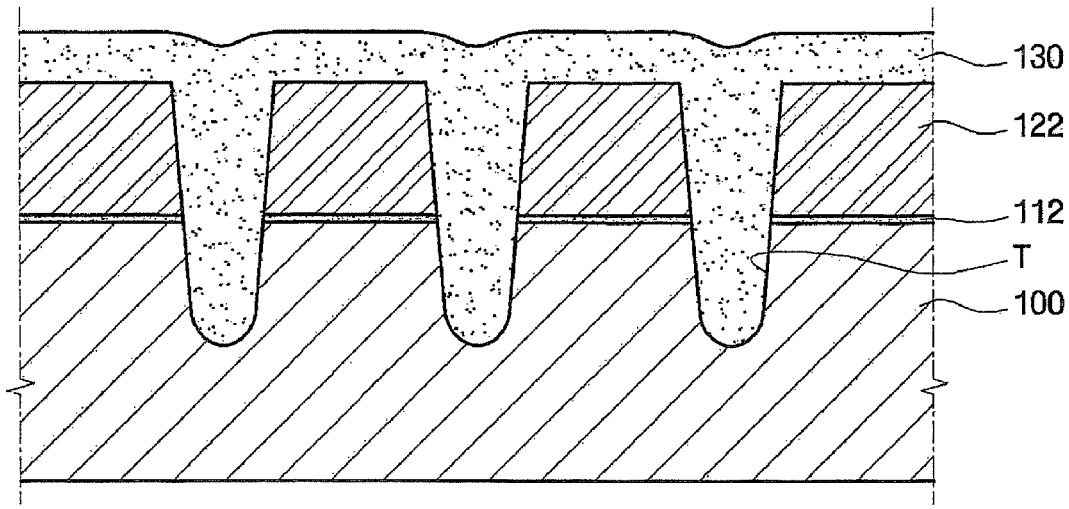

With reference to FIGS. 4 and 5, the photoresist pattern 300 is removed. The removal of the photoresist pattern 300 may be performed by means of an ashing process and/or a strip process using a strip solution. If a hard mask is used as the etching mask at the steps of FIGS. 3 and 4, the mask may be removed along with the photoresist pattern 300 at this step.

Subsequently, an insulating layer for isolation 130 is layered to fill the trench T. The insulating layer for isolation 130 may include, for example, silicon oxide. Examples of the silicon oxide film may include a USG (Undoped Silicate Glass) oxide film, a PE-TEOS (Plasma Enhanced Tetra Ethyl Ortho Silicate) oxide film, and/or an HDP (High Density Plasma) oxide film. The insulating layer for isolation 130 may fill the trench T of the semiconductor substrate 100, and the etched regions in the first insulating layer 112 and the sacrificial layer 122 on the semiconductor substrate 100. The insulating layer for isolation 130 may be formed to cover the surface of the first insulating layer 112. Accordingly, as shown in FIG. 5, the insulating layer for isolation 130 may cover the front side of the semiconductor substrate 100.

Figure 6:
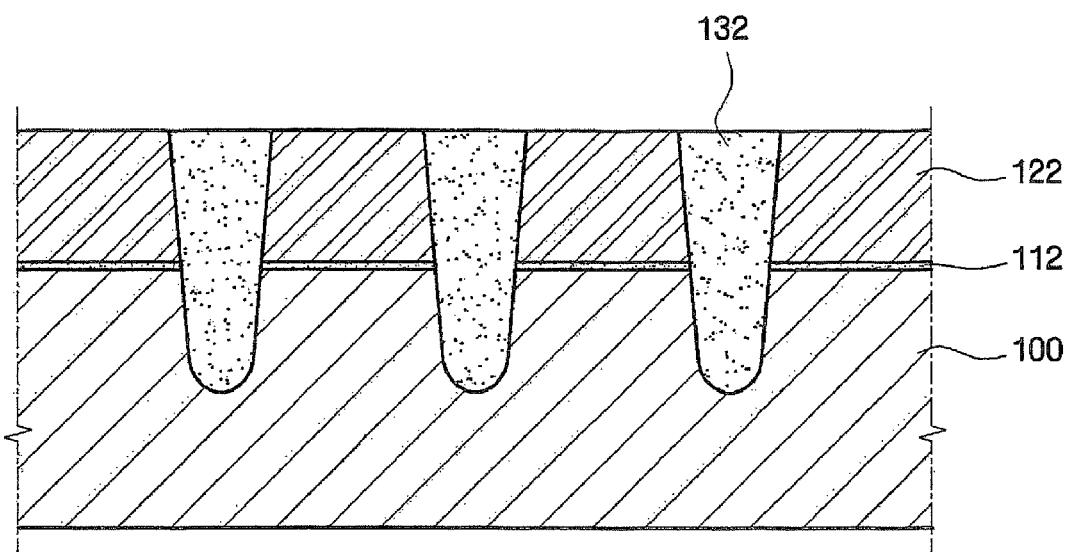

With reference to FIGS. 5 and 6, the resulting structure of FIG. 5 is subjected to a planarization process using etch back and/or chemical mechanical polishing (CMP) to expose the sacrificial layer 122. When the insulating layer for isolation 130 is subjected to the etch back, the etching gas is selected so that the sacrificial layer 122 acts as an etch stopper. When a CMP process is used, it may be desirable to select a slurry so that the sacrificial layer 122 acts as a CMP stopper.

Figure 7:
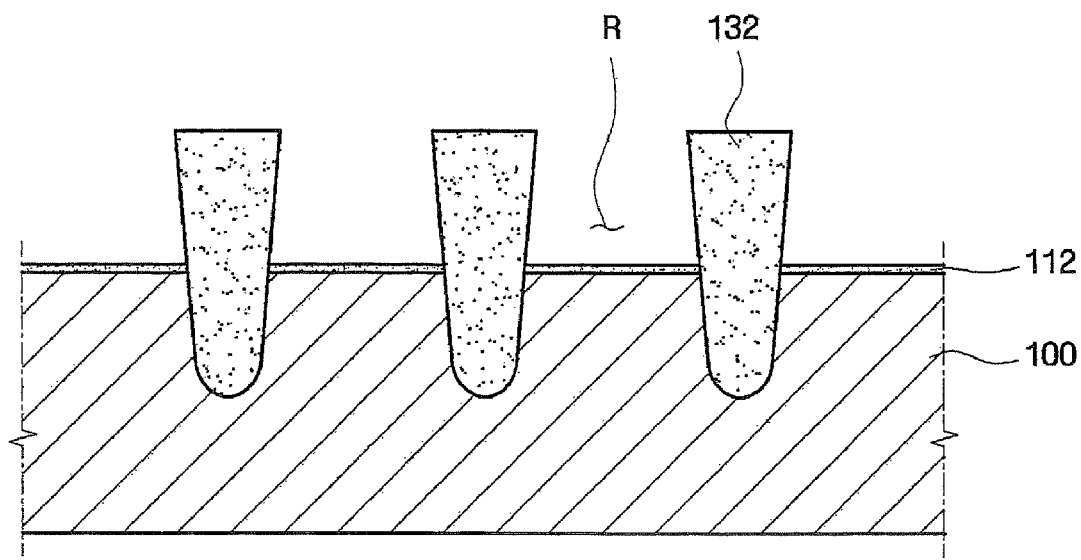

With reference to FIGS. 6 and 7, the exposed sacrificial layer 122 is removed, leaving isolation regions 132. The removal of the sacrificial layer 122 may be performed using, for example, wet etching. In order to remove the sacrificial layer 122, an etchant may be used that has an etching selectivity to the sacrificial layer 122 that is higher than the etching selectivity to the isolation regions 132 and the first insulating layer 112. In that case, only the sacrificial insulating layer 122 may be selectively removed, but the isolation regions 132 and the first insulating layer 112 may remain intact. Accordingly, the sacrificial layer 122 is removed to expose the first insulating layer 112 therebeneath. The floating electrode is provided in a space R on the first insulating layer 112, which is recessed with respect to the protruding isolation regions 132, using self alignment during a subsequent process.

Figure 8:
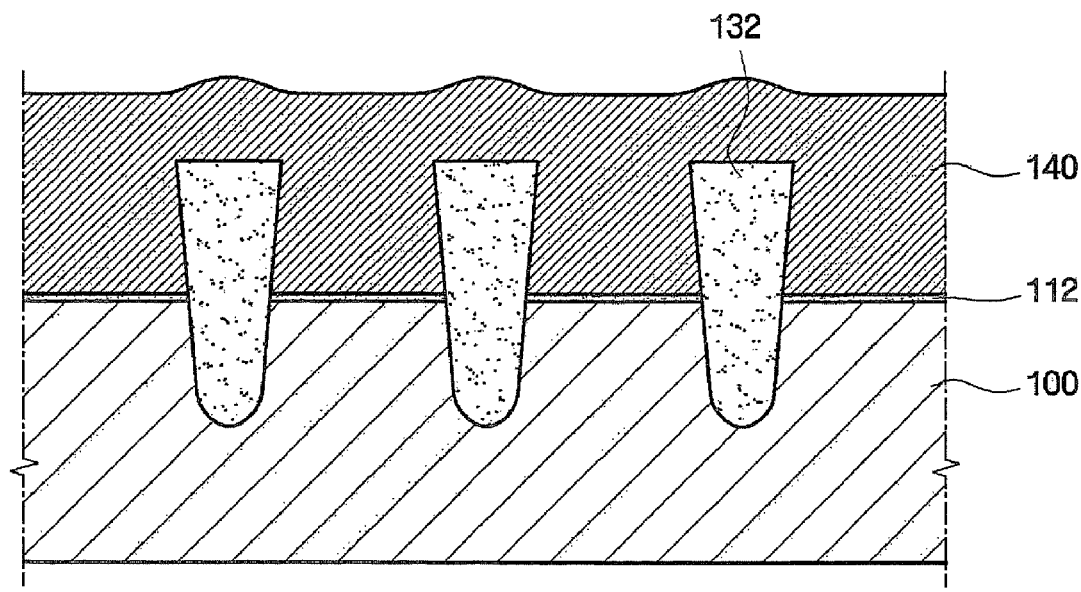

With reference to FIGS. 7 and 8, a conductive layer 140 is formed in the recessed space R and may cover the protruding isolation regions 132. The conductive layer 140 may include, for example, metal and/or polysilicon in which an N-type impurity and/or a P-type impurity is doped. The conductive layer 140 may be formed using a process, such as low pressure CVD (LPCVD), atomic layer deposition (ALD), physical vapor deposition (PVD), and/or metal organic CVD (MOCVD). The thickness of the layered conductive layer 140 may be about 100 nm to about 400 nm.

Figure 9:
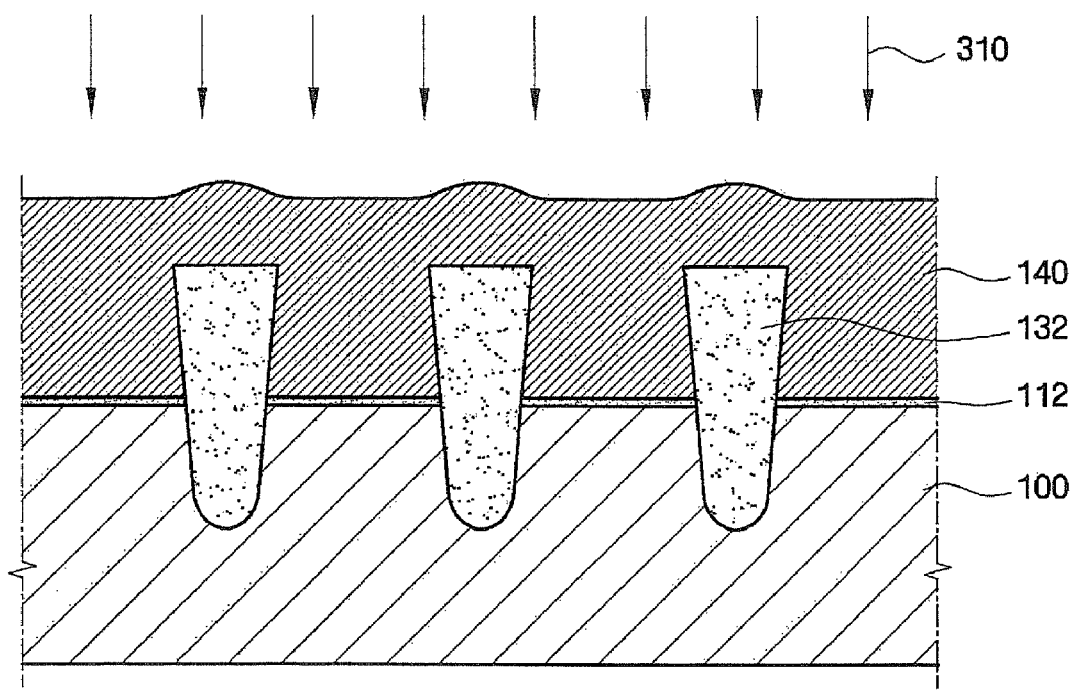

With reference to FIGS. 8 and 9, impurity ions, such as fluorine (F) ions, may be implanted into the conductive layer 140 (see reference numeral 310). Examples of dopants that are capable of being used during the implantation of fluorine ions include fluorine-based substances, such as F, $F_2$, $BF_2$, and/or $BF_3$. The fluorine ions are implanted so that the fluorine ions moves through the conductive layer 140 to the first insulating layer 112, where they may become bonded to Si dangling bonds of the first insulating layer 112. Accordingly, the ion implantation energy and dose used for the implantation process may depend on the thickness of the conductive layer 140. For example, when the thickness of the conductive layer 140 is about 100 nm to about 400 nm, fluorine ions may be implanted with an ion implantation energy of about 10 keV to about 30 keV in a dose of about $1.0E14$ atoms/cm$^2$ to about $1.0E16$ atoms/cm$^2$. The ion implantation may be performed in, for example, a $F_2$ and/or $NF_3$ gas atmosphere.

After ion implantation, heat treatment may be performed using, for example, a rapid thermal process (RTP) device and/or a furnace device in order to more uniformly diffuse the implanted fluorine ions and/or to activate the implanted ions. In particular, in when the heat treatment is performed using a furnace device, the heat treatment may be performed, for example, at the temperature of about 850° C. to about 1000° C. for a time of about 30 min. to about 50 min.

The implanted fluorine ions may become more uniformly diffused to/into the first insulating layer 112 as a result of the heat treatment, and may become bonded to Si dangling bonds and/or substitution bonded to Si imperfect bonds in the conductive layer 140, at the interface between the first insulating layer 112 and the conductive layer 140, within the first insulating layer 112, and at the interface between the first insulating layer 112 and the semiconductor substrate 100.

More specifically, since the first insulating layer 112 includes silicon oxide, Si in the layer is bonded to another Si, O, or H. However, states exist in which Si atoms are not so bonded, that is, Si dangling bonds may be present. The Si dangling bonds may degrade the leakage current property of the first insulating layer 112. Additionally, even though a Si atom of the first insulating layer 112 may be bonded to another Si, O, or H, if the bonding between them is unstable, some properties of the first insulating layer 112 may be impaired. For example, when the semiconductor device is a charge trap flash (CTF) device and the first insulating layer 112 is used as the tunnel oxide film, electrons may move through the tunnel oxide film during the program or erase operation and collide with the above-mentioned unstable bonds, thereby breaking the bonds. Accordingly, the electron retention property of the floating gate may be impaired.

Therefore, at this step, fluorine ions, which have relatively higher bonding energy with respect to Si, are implanted to the first insulating layer 112 to reduce the number of the Si dangling bonds and Si imperfect bonds, thereby potentially improving the properties of the first insulating layer 112. That is, the implanted fluorine ions may become directly bonded to the Si dangling bonds, or substitution bonded while breaking the imperfect Si bonds, to form stable Si—F bonds, thereby stabilizing the first insulating layer 112.

As described above, fluorine ions may be used as the impurity ions that are bonded to Si dangling bonds and/or substitution bonded to Si imperfect bonds. However, other impurity ions may be used, such as nitrogen ions, heavy hydrogen ions, and/or chlorine ions.

Figure 10:
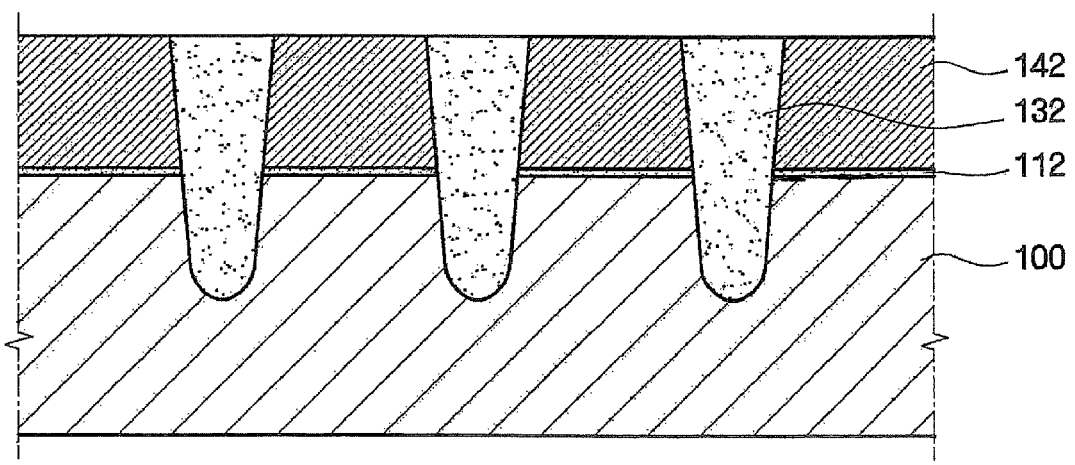

With reference to FIGS. 9 and 10, an upper portion of the conductive layer 140 may be partially removed. The removal process may be performed by a planarization process, such as a CMP process. The impurity ions are implanted into the upper surface of the conductive layer 140, as described above. If the implanted surface of the conductive layer 140 comes into contact with the second insulating layer (reference numeral 150 of FIG. 12) that is layered during a subsequent process, the insulating layer property of the second insulating layer (reference numeral 150 of FIG. 12) may be impaired. To be more specific, the implanted surface of the conductive layer 140 may be roughened due to physical impact of the implanted ions. If the second insulating layer (reference numeral 150 of FIG. 12) is formed on the rough surface, the thickness of the second insulating layer (reference numeral 150 of FIG. 12) may be nonuniform. Accordingly, when the second insulating layer (reference numeral 150 of FIG. 12) is used as the gate insulating layer, the reliability of the layer may be reduced. Additionally, when the conductive layer 140 is formed of polysilicon, some Si—Si bonds may be broken on the upper side of the conductive layer 140 due to ion implantation. Thus, some Si dangling bonds may be formed. As described above, the presence of Si dangling bonds may impair the leakage current property of the gate insulating layer. Therefore, the upper portion of the conductive layer 140 that is implanted with impurity ions may be removed at this step to possibly improve the reliability of the second insulating layer (reference numeral 150 of FIG. 12).

Furthermore, at this step, after the upper portion of the conductive layer 140 is partially removed, or at the same time the upper portion of the conductive layer 140 is partially removed, the conductive layer 140 may be divided by the protruding isolation regions 132. That is, the conductive layer 140 may be planarized until the protruding isolation regions 132 is exposed to remove the attacked conductive layer 140 and to fabricate the floating electrode 142 that is divided into cells. In connection with this, it may be desirable to perform the planarization process using the silicon oxide film that constitutes the protruding isolation regions 132 as the CMP stopper. That is, the planarization may be performed using a slurry for which the selectivity to the substance constituting the conductive layer 142, for example, polysilicon, is higher than the selectivity to silicon oxide. Moreover, at this step, since the floating electrodes 142 that are separated from each other according to the cells are formed using the self alignment without patterning by means of the mask, there may be less possibility of misalignment.

Figure 11:
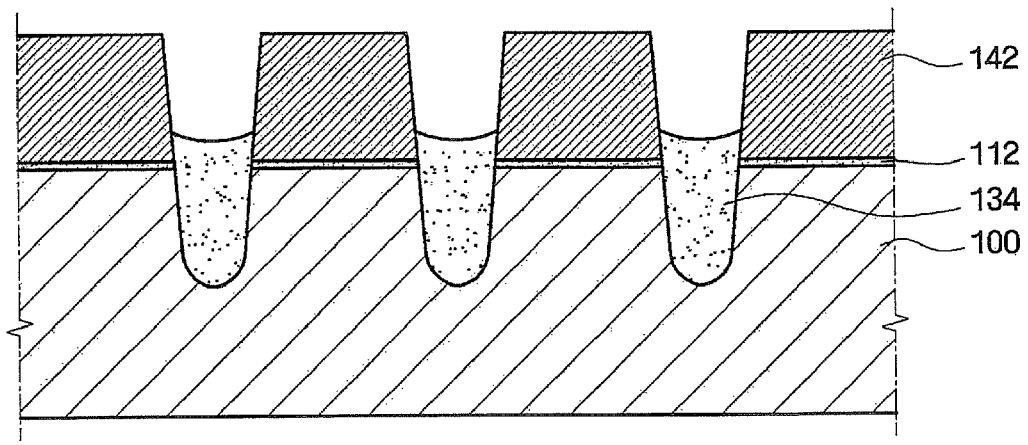

With reference to FIGS. 10 and 11, the protruding isolation regions 132 are partially etched so as to be recessed between adjacent electrodes 142. The partial etching process may be performed, for example, using an etch back process. The etching depth may be controlled using a process, such as the time control etching and/or EPD. The etching depth is controlled depending on the area between the floating electrode 142 and the control gate electrode (reference numeral 160 of FIG. 1) that is formed during the subsequent process according to the etching depth. In FIG. 11, the recess depth may be controlled so that the recessed surface of the isolation region 134 is higher than the first insulating layer 112. However, the recessing may be further performed so that the recessed surface of the isolation region 134 is lower than the first insulating layer 112.

Figure 12:
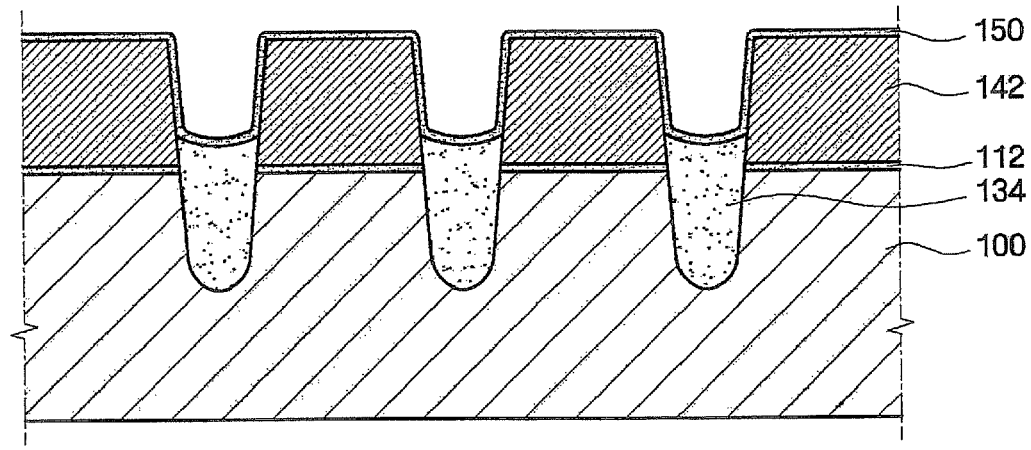

With reference to FIGS. 11 and 12, a second insulating layer 150 is formed on a front side of the resulting structure of FIG. 11. In particular, the second insulating layer 150 is formed on upper surfaces and lateral sides of the floating electrode 142, and on upper surfaces of the recessed isolation region 134. The second insulating layer 150 may include silicon nitride, silicon oxide, and/or a laminate film in which silicon nitride and silicon oxide are combined. For example, the second insulating layer may be formed of a three-layered film of silicon oxide/silicon nitride/silicon oxide (O/N/O). The formation of the second insulating layer 150 may be performed using a process, such as chemical vapor deposition (CVD), low pressure chemical vapor deposition (LPCVD), plasma enhanced chemical vapor deposition (PECVD), and/or a thermal oxidation process. The second insulating layer 150 may be interposed between the floating electrode 142 and the control gate electrode that is formed during a subsequent process to act as the gate insulating layer.

As described above, since a portion of the upper side of the floating electrode 142 that is directly implanted with ions is removed from the upper side that comes into contact with the layered second insulating layer 150, the reliability of the second insulating layer 150 may be improved.

Turning to FIG. 1, the control gate electrode 160 is formed on the second insulating layer 150. The control gate electrode 160 may be formed of, for example, a laminate film in which the first control gate electrode layer 162 that includes doped polysilicon and the second control gate electrode layer 164 that includes metal or a metal silicide film are layered. The control gate electrode 160 may form a single body without the division with respect to the two or more adjacent cells. Subsequently, other conventional features, such as interlayer insulating layers, vias, contacts, and/or wires may be formed on the resulting structure of FIG. 1 to fabricate the semiconductor device.

Some methods of fabricating the semiconductor device of FIG. 2 will now be described. FIGS. 13 to 18 are cross-sectional views of intermediate structures formed at steps of methods of fabricating the semiconductor device shown in FIG. 2 according to some embodiments.

Some aspects of the methods of fabricating the semiconductor device shown in FIG. 2 may be similar to the embodiments of FIGS. 3 to 7, with the exception of the processes after the formation of the protruding isolation regions and the formation of the first insulating layer on a portion of the surface of the semiconductor substrate between the protruding isolation regions. Subsequently, with reference to FIG. 13, the first conductive layer 242 is formed so as to partially fill a region R' that is recessed with respect to the protruding isolation regions 132. For example, the first conductive layer 242 may be made of metal and/or polysilicon in which an N-type impurity or a P-type impurity is doped. The first conductive layer 242 may be formed using a process such as low pressure CVD (LPCVD), atomic layer deposition (ALD), physical vapor deposition (PVD), and/or metal organic CVD (MOCVD). The layered first conductive layer 242 may fully cover the first insulating layer 112 and may have a thickness that is controlled so that the first conductive layer 242 may be recessed downward with respect to the upper side of the protruding isolation regions 132 in the recessed region R'. In other words, it may be desirable that the first conductive layer 242 is not higher than the protruding isolation regions 132 in the recessed region R'. Meanwhile, a portion of the first conductive layer 242 may be layered on the upper side of the isolation regions 132 according to the layering method of the first conductive layer 242, but may be removed during a subsequent process.

Figure 13:
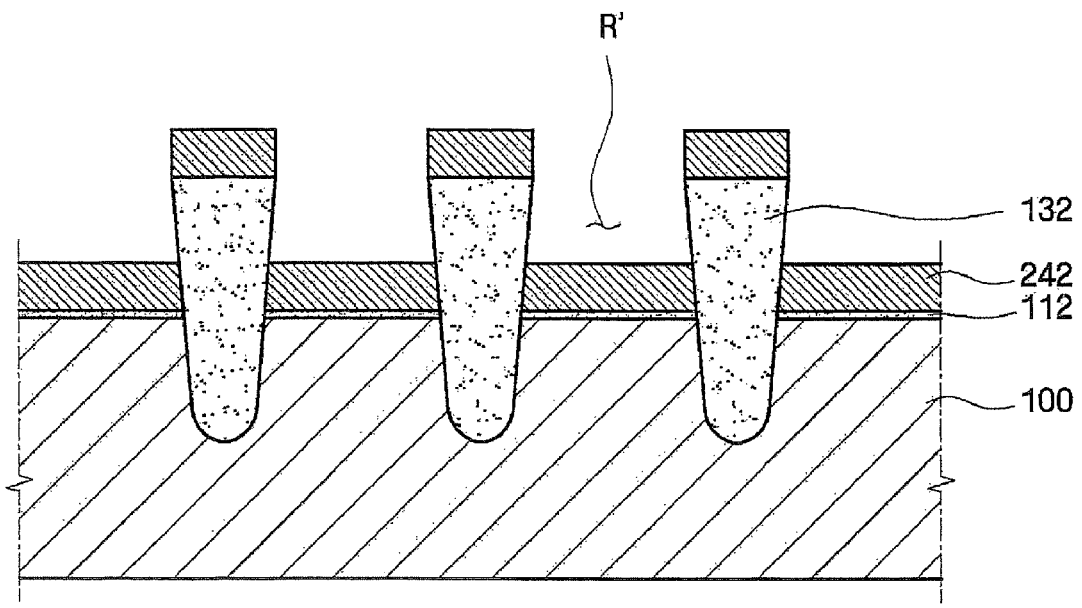
FIGS. 13 to 18 are cross-sectional views illustrating the formation of semiconductor devices according to further embodiments of the present invention.
Figure 14:
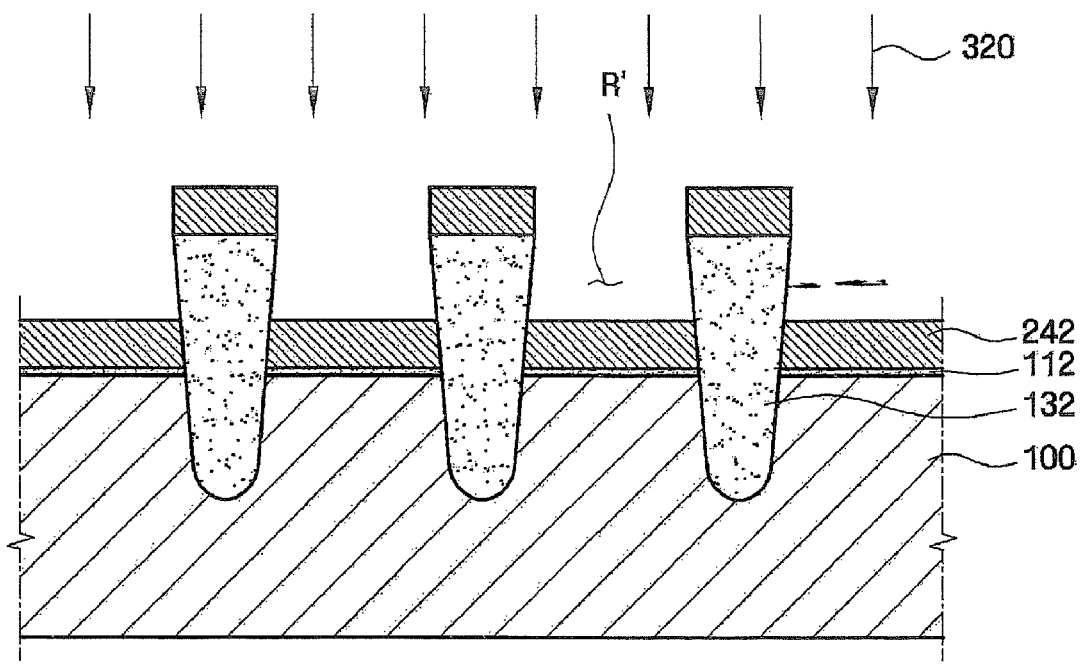

With reference to FIGS. 13 and 14, impurity ions may be implanted into the first conductive layer 242 (see reference numeral 320). This step may be similar to the step of implanting the impurity ions in FIG. 9. That is, the impurity ions are implanted in order to become bonded to Si dangling bonds in the first insulating layer 112. In addition to, or instead of, fluorine-based ions, nitrogen ions, heavy hydrogen ions, and/or chlorine ions may be used as the impurity ions. Additionally, after the ions are implanted, heat treatment may be performed to more uniformly diffuse the implanted impurity ions, similar to the process described in connection with FIG. 9. However, the implantation step may be different from that of FIG. 9 due to the thickness of the first conductive layer 242 through which the impurity ions move to the first insulating layer 112. Accordingly, the ion implantation conditions, such as the ion implantation energy and/or the dose, may be different from those of FIG. 9.

Figure 15:
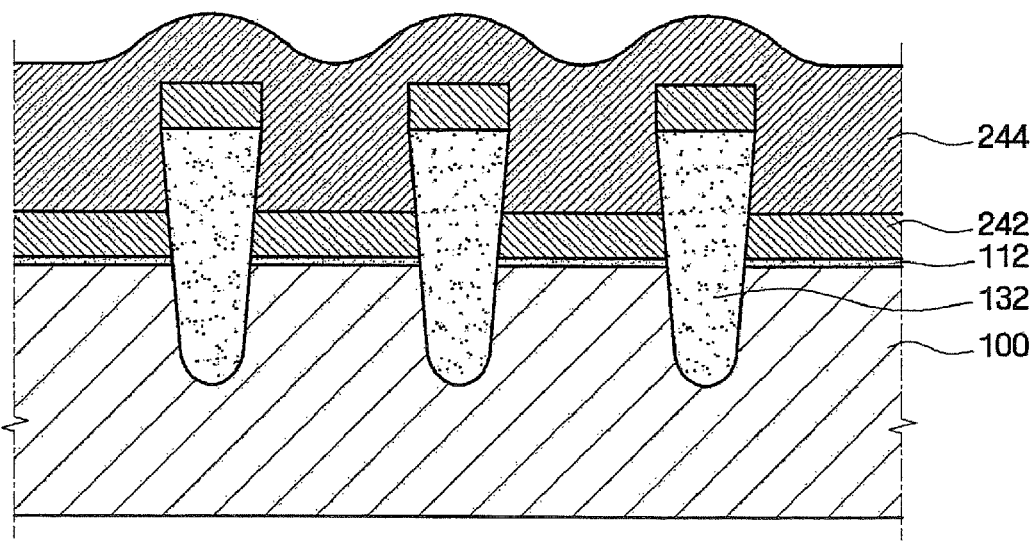

With reference to FIGS. 14 and 15, a second conductive layer 244 is formed on the resulting structure of FIG. 14. The second conductive layer 244 may fill the recessed region R' and may cover the protruding isolation regions 132. For example, the second conductive layer 244 may include metal, intrinsic polysilicon, and/or polysilicon in which an N-type impurity, or a P-type impurity is doped. The material that constitutes the second conductive layer 244 may be the same as or different from the material that constitutes the first conductive layer 242. For example, the first conductive layer 242 may include polysilicon in which N-type impurities are doped, and the second conductive layer 244 may include intrinsic polysilicon.

Figure 16:
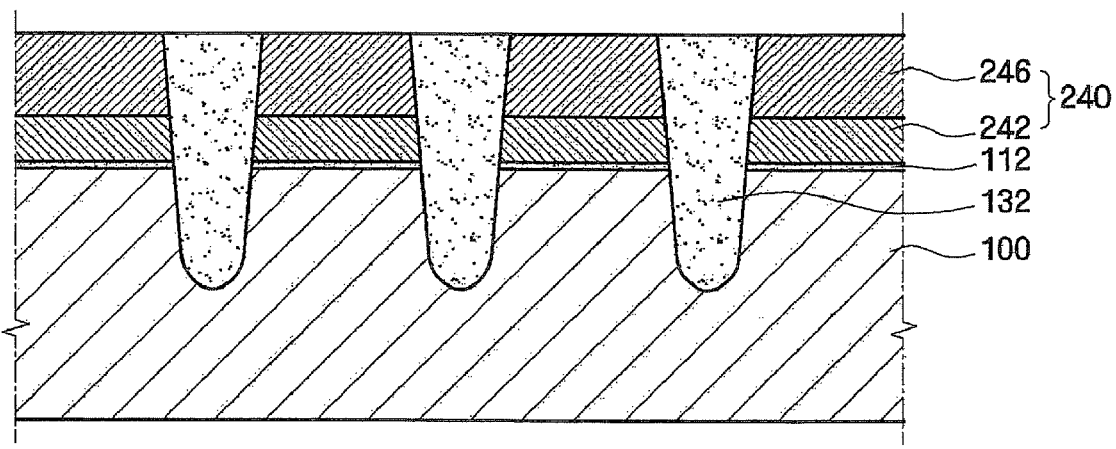

With reference to FIGS. 15 and 16, the upper portion of the second conductive layer 244 is removed to expose the protruding isolation regions 132, thereby forming the floating electrodes 240 that include the first conductive layers 242 and the second conductive layers 246. The removal of the upper portion of the second conductive layer 244 may be performed using the CMP process shown in FIG. 10. In connection with this, it may be desirable that the second conductive layer 246 almost completely remains on the first conductive layer 242 so as not to expose the first conductive layer 242. To achieve this, it is desirable that the upper side of the first conductive layer 242 is lower than the upper side of the protruding isolation regions 132 during the formation of the first conductive layer 242. Meanwhile, the upper side of the first conductive layer 242 may be attacked due to the implantation of the impurity ion. If the implanted surface of the first conductive layer 242 is entirely covered with the second conductive layer 246, even though the second insulating layer (reference numeral 150 of FIG. 17) is formed during a subsequent process, since the second insulating layer does not come into contact with the implanted surface of the first conductive layer, the reliability of the second insulating layer (reference numeral 150 of FIG. 17) may be enhanced.

Figure 17:
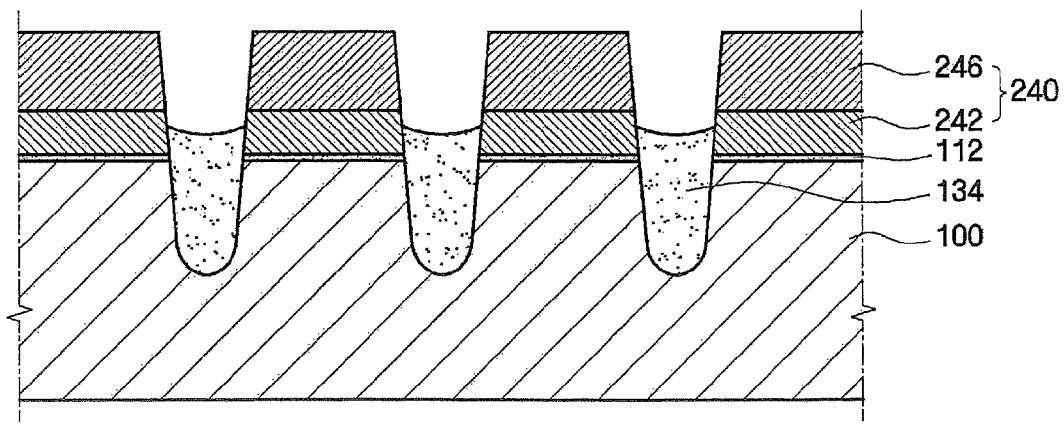
Figure 18:
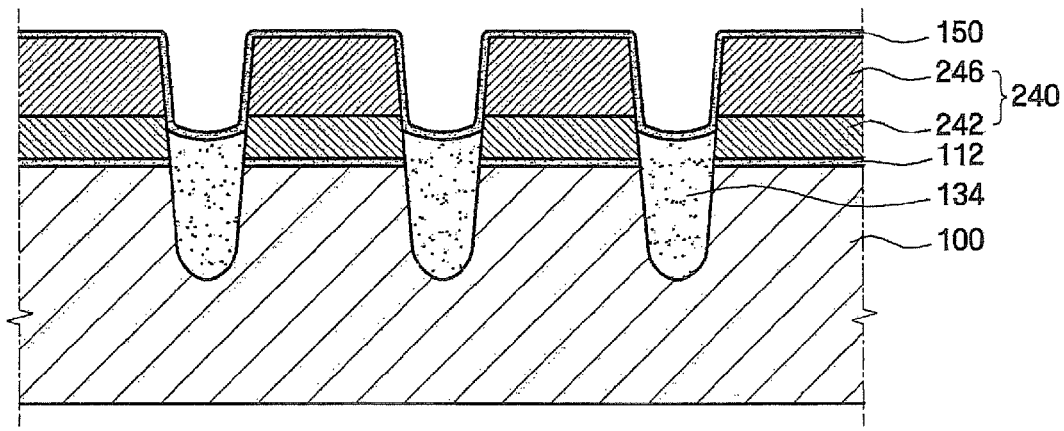

With reference to FIGS. 16 and 17, the protruding isolation regions 132 are partially etched to be recessed (see reference numeral 134). With reference to FIGS. 17 and 18, the second insulating layer is formed on the resulting structure of FIG. 17. The steps of FIGS. 17 and 18 are substantially similar to those of FIGS. 11 and 12. Subsequently, the control gate electrode 160 is formed on the resulting structure of FIG. 18, thereby forming the semiconductor device shown in FIG. 2.

In semiconductor devices and/or methods of forming the same according to embodiments of the present invention, the number of Si dangling bonds and/or Si imperfect bonds in a tunnel oxide film may be reduced due to implantation of impurity ions. As a result, some properties of a first insulating layer provided between a semiconductor substrate and a floating electrode may be improved. Furthermore, since a surface of a conductive layer is removed, or another conductive layer is layered thereon after the implantation of the impurity ions, a second insulating layer may not contact the surface of the conductive layer that was attacked during the ion implantation process. Therefore, the reliability of the second insulating layer that is provided between the conductive layer and a control gate electrode may be enhanced.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A semiconductor device comprising:
    a semiconductor substrate having a surface;
    buried isolation regions protruding from the surface of the semiconductor substrate;
    a first insulating layer on the surface of the semiconductor substrate between the isolation regions and comprising a fluorine, nitrogen, and/or heavy hydrogen impurity;
    a floating electrode on the first insulating layer;
    a second insulating layer on the floating electrode and the isolation regions; and
    a control gate electrode on the second insulating layer.

2. The device of claim 1, wherein the floating electrode comprises a non-implanted surface, and wherein the second insulating layer is on the non-implanted surface of the floating electrode.

3. The semiconductor device of claim 1, wherein the first insulating layer comprises a silicon oxide film including an Si—F bond.

4. The semiconductor device of claim 1, wherein the floating electrode comprises a fluorine, nitrogen, and/or heavy hydrogen impurity.

5. The semiconductor device of claim 4, wherein the floating electrode comprises polysilicon including an Si—F bond.

6. A semiconductor device comprising:
a semiconductor substrate including a surface;
buried isolation regions protruding from the surface of the semiconductor substrate;
a first insulating layer on the semiconductor substrate between the isolation regions and comprising a fluorine, nitrogen, and/or heavy hydrogen impurity;
a floating electrode on the first insulating layer and comprising a first conductive layer and a second conductive layer;
a second insulating layer on the floating electrode and the isolation regions; and
a control gate electrode on the second insulating layer.

7. The device of claim 6, wherein the first conductive layer is between the first insulating layer and the second conductive layer; and
wherein the first conductive layer includes the fluorine, nitrogen, and/or heavy hydrogen impurity, and the second conductive layer is substantially free of the fluorine, nitrogen, and/or heavy hydrogen impurity.

8. The semiconductor device of claim 6, wherein the first insulating layer comprises a silicon oxide film including an Si—F bond.

9. The semiconductor device of claim 6, wherein the first conductive layer includes a fluorine, nitrogen, and/or heavy hydrogen impurity.

10. The semiconductor device of claim 9, wherein the first conductive layer comprises polysilicon including an Si—F bond.

* * * * *